US011480717B2

(12) United States Patent
Weidmann et al.

(10) Patent No.: US 11,480,717 B2
(45) Date of Patent: Oct. 25, 2022

(54) GRATING STRUCTURE FOR A DIFFRACTIVE OPTIC

(71) Applicant: DR. JOHANNES HEIDENHAIN GmbH, Traunreut (DE)

(72) Inventors: Josef Weidmann, Feichten (DE); Peter Speckbacher, Kirchweidach (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 286 days.

(21) Appl. No.: 16/589,160

(22) Filed: Oct. 1, 2019

(65) Prior Publication Data
US 2020/0110204 A1 Apr. 9, 2020

(30) Foreign Application Priority Data

Oct. 9, 2018 (DE) ...................... 10 2018 217 199.8

(51) Int. Cl.
*G02B 5/18* (2006.01)
*B29D 11/00* (2006.01)
*G03F 9/00* (2006.01)

(52) U.S. Cl.
CPC ...... *G02B 5/1847* (2013.01); *B29D 11/00769* (2013.01); *G02B 5/1814* (2013.01); *G02B 5/1828* (2013.01); *G02B 5/1857* (2013.01); *G02B 5/1861* (2013.01); *G03F 9/7088* (2013.01)

(58) Field of Classification Search
CPC .. G02B 5/1847; G02B 5/1814; G02B 5/1828; G02B 5/1861; G02B 5/1866; G02B 5/1857; G02B 5/1871; G02B 5/18; B29D 11/00769; G03F 9/7088; G03F 1/78
See application file for complete search history.

(56) References Cited

U.S. PATENT DOCUMENTS

| 8,865,377 B2 * | 10/2014 | Jacques | G03F 1/36 430/5 |
| 2002/0034710 A1 * | 3/2002 | Morris | G02B 5/0252 430/321 |
| 2004/0155309 A1 * | 8/2004 | Sorin | G01N 21/554 257/431 |

(Continued)

FOREIGN PATENT DOCUMENTS

EP 3321641 A1 5/2018

*Primary Examiner* — Stephone B Allen
*Assistant Examiner* — Gabriel A Sanz
(74) *Attorney, Agent, or Firm* — Leydig, Voit & Mayer, Ltd.

(57) ABSTRACT

A grating structure for a diffractive optic includes grating lines, each of which is approximated by successive segments. Longitudinal axes of the segments each have an angle relative to a first coordinate axis of a reference coordinate system. A first section of a first one of the grating lines is approximated by a first group of the segments, and a second section adjacent to the first section of the first grating line is approximated by a second group of segments. The longitudinal axes of a major portion of the segments of the first group have a first predetermined angle relative to the first coordinate axis of the reference coordinate system, and the longitudinal axes of a major portion of the segments of the second group have a second predetermined angle different from the first predetermined angle relative to the first coordinate axis of the reference coordinate system.

17 Claims, 7 Drawing Sheets

(56) References Cited

U.S. PATENT DOCUMENTS

| | | | |
|---|---|---|---|
| 2008/0197295 A1* | 8/2008 | Kaule | G11B 7/007 250/492.3 |
| 2010/0238529 A1* | 9/2010 | Sampsell | G02B 5/32 359/15 |
| 2011/0186744 A1* | 8/2011 | Anze | H01J 3/14 250/396 R |
| 2011/0278731 A1 | 11/2011 | Chau et al. | |
| 2013/0283216 A1* | 10/2013 | Pearman | G06F 30/00 716/52 |
| 2014/0050441 A1* | 2/2014 | Wakabayashi | G02B 5/189 385/37 |
| 2018/0284466 A1* | 10/2018 | Moebius | G02F 1/335 |

* cited by examiner

GRATING STRUCTURE FOR A DIFFRACTIVE OPTIC

CROSS-REFERENCE TO PRIOR APPLICATION

Priority is claimed to German Patent Application No. DE 10 2018 217 199.8, filed on Oct. 9, 2018, the entire disclosure of which is hereby incorporated by reference herein.

FIELD

The present invention relates to a grating structure for a diffractive optic.

BACKGROUND

In the prior art, there are known grating structures having periodically arranged grating lines. In particular, such grating structures form diffraction gratings for transmitting or reflecting light with different phase-shifting effects.

Fine planar grating structures, such as, for example, optical elements for diffractive optical elements or diffraction gratings or waveguides, are typically produced by direct-write lithography processes. For structure widths, i.e. the widths of the bar-shaped grating lines of the corresponding grating structures, of only a few hundred nm, this is typically done using electron beam devices. The electron beams produced using such electron beam devices can be focused to spots of up to nanometers in diameter.

However, with beam areas as small as this, very long exposure times are needed for larger areas of the structure and, therefore, spot beam devices (commonly referred to as "Gaussian beam writers") are only suitable for producing structures of relatively small area. When structures of larger area are needed, one has to switch over to the significantly more complex shaped beam technology (variable shaped beam, VSB). VSB technology uses a sheet-like electron beam. The electron beam is generated in the electron source and usually shaped to a circular beam cross section by a beam stop. The maximum usable area is limited by the radial homogeneity of the current density. Typically, it is desired to achieve a homogeneity of a few percent, resulting in a maximum diameter $D_{MAX}$. The value of $D_{max}$ is typically in the range of 1-20 μm. In VSB technology, arbitrary rectangles (commonly referred to as "variable Manhattan rectangles") of a size up to that of a maximum square are cut out from the circular area by superposition of two square aperture stops with the aid of electric and/or magnetic deflection. The variable Manhattan rectangles are also referred to as "stamps" or "shapes." These stamps or shapes are generated in a pulsed manner (with pulse durations typically in the range of a few microseconds) and placed on a substrate surface to be irradiated using additional electric and/or magnetic deflection systems. In addition, the substrate surface is moved using an X-Y positioning stage.

VSB technology is in particular suitable for irradiating rectangular structures, i.e., structures having edges parallel to the x- and y-axes of a reference coordinate system or of the X-Y positioning stage (commonly referred to as Manhattan structures). In comparison with spot beam devices, significant speed advantages can thereby be achieved with respect to exposure time. However, in the case of non-rectangular, i.e. non-orthogonal structures, the speed advantage is reduced because oblique lines have to be formed by very fine staircase approximations, which requires the use of a multitude of small rectangular stamps or shapes.

If, finally, the structure is only composed of narrow, non-orthogonal structures, and thus no major individual surfaces exist, as in the case of fine planar grating structures, the above-mentioned advantage of VSB technology disappears almost completely. In this case, the number of stamps, and thus the exposure time, increases significantly. On the other hand, increasing the approximation limit to reduce the number of stamps leads to a corresponding increase in line edge roughness (LER). In the case of very oblique lines; i.e., in the case of angles far off the 0° and 90° degree angles defined in the reference coordinate system, VSB technology also has the disadvantage that the approximation is quickly limited by merging of adjacent structures. Overall, therefore, in VSB technology, especially when used to approximate oblique or curved lines of the structure, the number of stamps, and thus the exposure time, remains too high from a technical and economic point of view.

U.S. Pat. No. 8,865,377 B2 discloses a method and system for forming a diagonal pattern using VSB technology. The diagonal pattern illustrated in FIG. 9B includes a plurality of successive segment sections for approximating a portion of a silicon wafer, where longitudinal axes of adjacent ones of the segment sections have different angles relative to a first coordinate axis of a reference coordinate system.

SUMMARY

In an embodiment, the present invention provides a grating structure for a diffractive optic including a plurality of grating lines. Each of the grating lines are approximated by a plurality of successive segments. Longitudinal axes of the segments each have an angle relative to a first coordinate axis of a reference coordinate system. A first section of a first one of the grating lines is approximated by a first group of the segments, and a second section adjacent to the first section of the first one of the grating lines is approximated by a second group of segments. The longitudinal axes of a major portion of the segments of the first group have a first predetermined angle relative to the first coordinate axis of the reference coordinate system, and the longitudinal axes of a major portion of the segments of the second group have a second predetermined angle different from the first predetermined angle relative to the first coordinate axis of the reference coordinate system.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
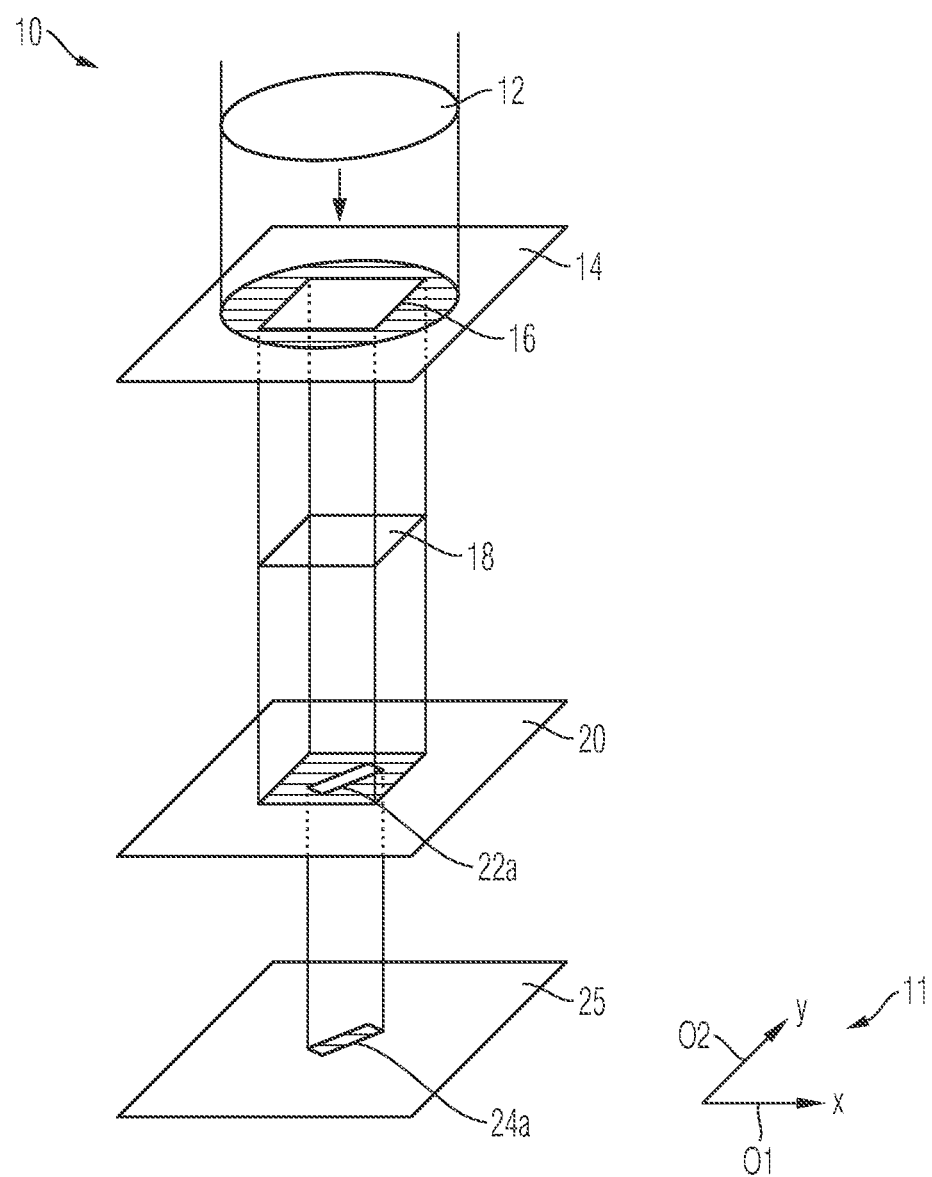
FIG. 1 is a schematic view of a system for performing cell projection using a reticle to form a segment for approximation of a grating line of a grating structure according to an embodiment of the present invention.

The inventors have recognized that the prior art methods for approximating the grating lines of a grating structure have the particular disadvantage that when the angles of the longitudinal axes of the segments are selected, at each position of the grating lines of the grating structure, as a function of a minimum line edge roughness to be achieved, an abrupt change in angle or direction occurs at a boundary point between two adjacent segments whose longitudinal axes have different angles, which change in angle or direction occurs at approximately the same position (or at the same tangent angle; i.e., angle of the tangent of the respective grating line) for all grating lines of the grating structure. Macroscopically, this in turn leads to the formation of different sections or zones, each including one of the two adjacent segments. Then, a sudden change in light diffraction occurs at the section and/or zone boundaries since the microscopic effect of light diffraction at a single boundary point is intensified because it sums up across the multiplicity of segments of all grating lines.

In an embodiment, the present invention provides a grating structure for a diffractive optic which grating structure is of high quality and whose grating lines are nearly optimally approximated by segments.

The inventive grating structure for a diffractive optic according to an embodiment includes a plurality of grating lines, each grating line being approximated by a plurality of successive segments. Longitudinal axes of the segments each have an angle relative to a first coordinate axis of a reference coordinate system. A first section of a grating line is approximated by a first group of segments, and a second section adjacent to the first section of the grating line is approximated by a second group of segments. The longitudinal axes of a major portion of the segments of the first group have a first predetermined angle relative to the first coordinate axis of the reference coordinate system, and the longitudinal axes of a major portion of the segments of the second group have a second predetermined angle different from the first predetermined angle relative to the first coordinate axis of the reference coordinate system. Due to the different predetermined orientations of the major portions of the segments of the first and second groups, it is possible to achieve or maintain a nearly optimal approximation of the grating lines, in particular of oblique (straight) or partially curved lines of the grating structure.

The above-mentioned "major portion" is understood to mean in particular that the longitudinal axes of most or all of the segments of the first and second groups have the respective predetermined angle.

Preferably, one or more of the angles of the longitudinal axes of the segments of the first group and/or one or more of the angles of the longitudinal axes of the segments of the second group are each randomly selected from the entirety of at least the first predetermined angle and the second predetermined angle. The aforementioned stochastic blurring of the orientations of the segments of the first and second groups makes it possible to avoid a sudden change in light diffraction as a macroscopic effect occurring as a result of an abrupt change in angle or direction at respective boundary points between two adjacent segments of the grating lines.

Preferably, the randomly selected angles of the longitudinal axes of the segments of the first group and/or the second group each correspond with a first probability to the first predetermined angle and with a second probability to the second predetermined angle.

Preferably, the first probability and the second probability are dependent on a distance of the individual segments of the first group and/or the second group from a boundary point at which the two sections of the grating line meet. In addition, the first probability and the second probability may also be dependent on a differential angle, i.e. the difference between the first or second predetermined angle and the (local) tangent angle within the two sections of the grating line. For example, in the latter case, the first probability and the second probability each decrease from a maximum value (e.g., 100%) for a differential angle of 0° (i.e., the first or second predetermined angle coincides with the local tangent angle) through a lower value (e.g., 50%), as compared to the maximum value, for a differential angle that corresponds to the average of the first and second predetermined angles to a minimum value (e.g., 0%) for a further differential angle that corresponds to the respective other predetermined angle.

It is advantageous if the first probability and/or the second probability each have a profile extending over at least a portion of the segments of the first and second groups. This makes it possible to suitably adjust the degree of stochastic blurring, in particular across a boundary line defined by the boundary points.

Preferably, the profile of the first probability and/or the profile of the second probability each have a linearly, sinusoidally or exponentially falling edge. The profile of the first or second probability may also be given by other mathematical functions, and may in particular have an edge that is characterized by a function which is symmetrical about the boundary point.

It is advantageous if the segments of at least two adjacent grating lines have positions which are offset relative to one another along a longitudinal extent of the grating lines, and if the offset of these positions along the longitudinal extent of the grating lines is selected at random. The stochastic variation of the positions of the segments avoids the formation of a two-dimensional supergrating, which may result from a regular arrangement of edges of adjacent segments of a multiplicity of grating lines. Consequently, unwanted diffraction effects caused by such a supergrating can also be prevented or at least suppressed.

Furthermore, it is advantageous if the segments for approximating the grating lines are each exposure areas formed on a substrate surface by cell projection using different, individually selectable reticles. The use of reticles for forming the segments with different orientations makes it possible, on the one hand, to achieve high approximation accuracy and, on the other hand, to significantly reduce the number of segments required for approximation.

Preferably, the one or more of the angles of the longitudinal axes of the segments of the first group and/or the one or more of the angles of the longitudinal axes of the segments of the second group are each randomly selected from the entirety of the first predetermined angle and the second predetermined angle (which is commonly referred to as "two-angle mixing scheme"). Furthermore, the aforementioned angles may also each be randomly selected from the entirety of the first predetermined angle, the second predetermined angle and a third predetermined angle different from the first predetermined angle and the second predetermined angle (which is commonly referred to as "three-angle mixing scheme"). Also possible is a mixture of more than three angles; i.e., a four-angle mixing scheme or higher.

The above-mentioned multi-angle mixing scheme; i.e., the at least two-angle mixing scheme, produces the effect of stochastic blurring.

The inventive grating structure serves, in particular, as a mask (i.e., photomask) for a lithography process and is used for mass production of corresponding grating structures by copying.

Other details and advantages of the present invention will be apparent from the following description of exemplary embodiments, taken in conjunction with the figures.

FIG. 1 shows, in schematic form, a system 10 for performing cell projection (CP) using a reticle 22a to form a segment 24a for approximation of a grating line of a grating structure according to the present invention. The system 10 according to FIG. 1 includes a first plate-shaped aperture structure 14 and a second plate-shaped aperture structure 20. First plate-shaped aperture structure 14 has a square aperture 16. Second plate-shaped aperture structure 20 includes the reticle 22a, which takes the form of a rectangular (fixed) aperture. Reticle 22a is one of a plurality of individually selectable reticles which have different orientations relative to one of the two coordinate axes O1, O2 of a reference coordinate system 11; i.e., different angles between their longitudinal axes and one of the two coordinate axes O1, O2.

FIG. 1 shows an electron beam 12 generated by an electron source. Electron beam 12 has a circular beam cross section. Once the electron beam 12 has passed through the square aperture 16 of first plate-shaped aperture structure 14, a square-trimmed portion 18 is produced from the circular beam cross section. The square-trimmed portion 18 impinges on second plate-shaped aperture structure 20. Once the square-trimmed portion 18 has passed through reticle 22a of second plate-shaped aperture structure 20, a corresponding rectangular segment 24a (e.g., a line segment having a specific angle of inclination) is produced from square-trimmed portion 18. Segment 24a is projected onto a substrate surface 25. Substrate surface 25 can be moved by an X-Y positioning stage in the x-direction; i.e. parallel to first coordinate axis O1 of reference coordinate system 11, and in the y-direction; i.e. parallel to second coordinate axis O2 of reference coordinate system 11.

By the cell projection explained with reference to FIG. 1, the grating line to be approximated, in particular an oblique (straight) or partially curved line of the grating structure, can be approximated using a minimum number of segments.

Figure 2:
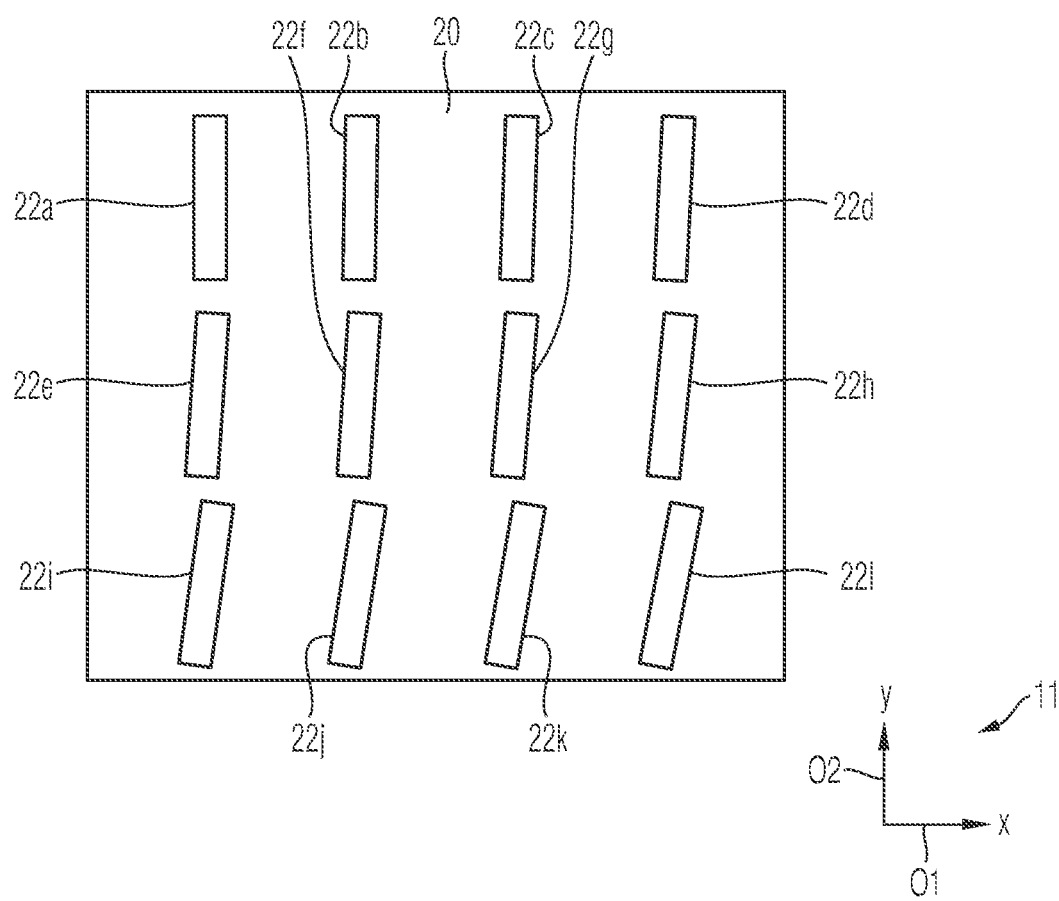
FIG. 2 is a plan view of a plate-shaped aperture structure of the system shown in FIG. 1, which aperture structure includes different, individually selectable reticles.

FIG. 2 shows, in plain view, the second plate-shaped aperture structure 20 of the system 10 shown in FIG. 1, which aperture structure includes different, individually selectable reticles 22a through 22l. Reticles 22a through 22l each have an identical, rectangular shape. Furthermore, reticles 22a through 22l have different orientations; i.e., different angles between the longitudinal axes and the two coordinate axes O1, O2 of reference coordinate system 11. For example, the angles of the longitudinal axes of reticles 22a through 22l relative second coordinate axis O2 range from 0° to 11° with angular increments of 1°. For an overall good approximation of the grating line, especially a curved line, a multiplicity of reticles with different orientations (or inclinations) should be provided. The angular increment value is dependent on the desired quality of approximation. The smaller the angular increment value, the greater the attainable approximation quality. However, the quality of approximation is limited by the possible number of different reticles selectable by the system 10 shown in FIG. 1.

Instead of a constant angular increment value (e.g., angular increments of 1°), it is also possible to choose a variable value for the angular increments.

Figure 3:
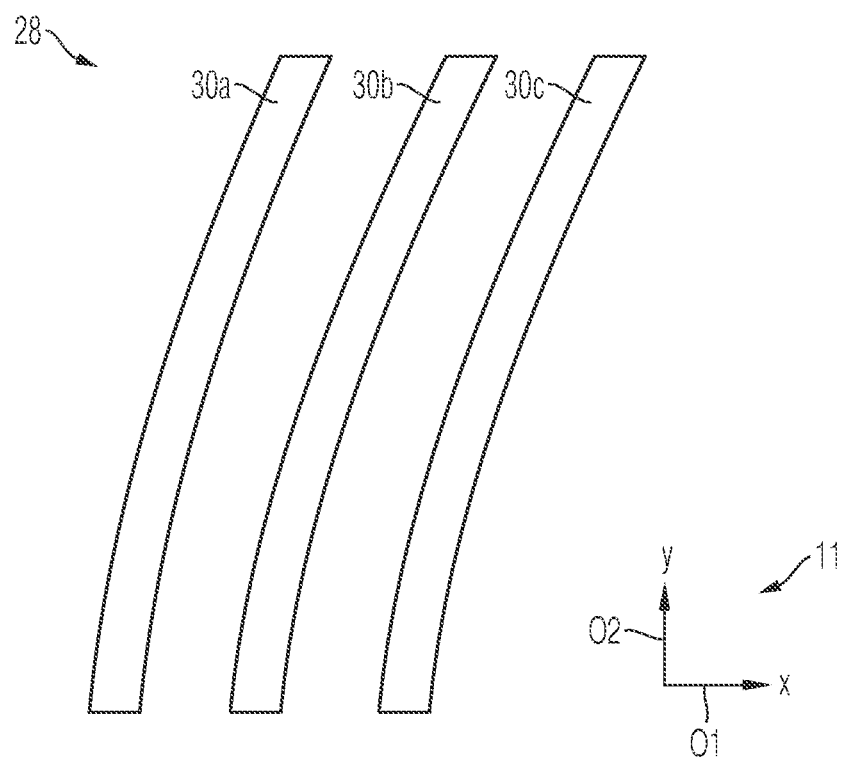
FIG. 3 is a representation of grating lines of a grating structure according to an embodiment of the present invention.

FIG. 3 depicts grating lines 30a through 30c of a grating structure 28 according to the present invention. Grating lines 30a to 30c are in particular curved lines having substantially the same inclination or orientation in relation to reference coordinate system 11. Grating lines 30a to 30c form a regular arrangement, which serves as a mask for a lithography process and is used for mass production of the corresponding grating structures by copying.

Figure 4:
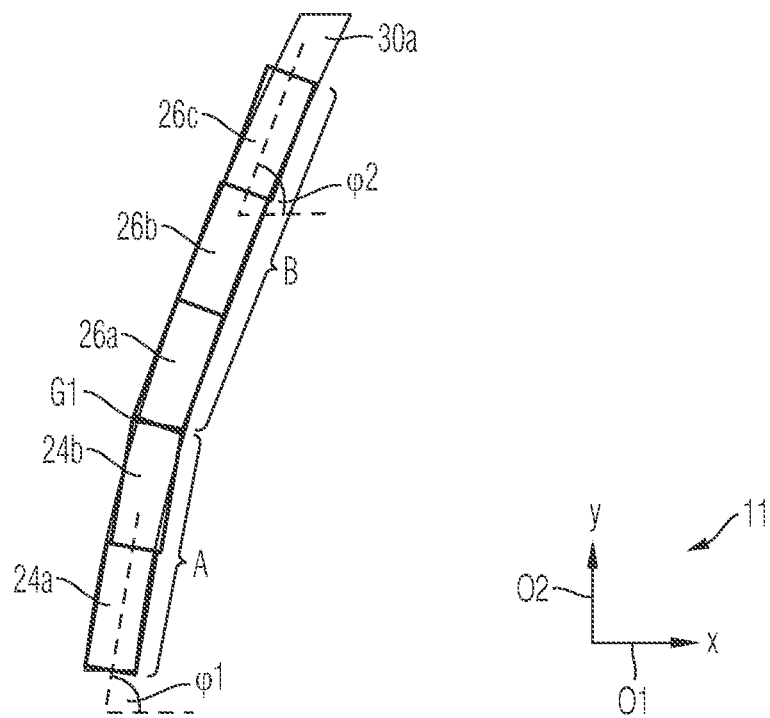
FIG. 4 is a view showing a grating line of the inventive grating structure, which grating line is approximated by a plurality of successive segments of a first group and a second group.

FIG. 4 depicts grating line 30a of the grating structure 28. Grating line 30a is approximated by a plurality of successive segments 24a, 24b and 26a through 26c of a first group and a second group. The longitudinal axes of segments 24a, 24b and 26a through 26c each have an angle (i.e. angle of inclination φ) relative to first coordinate axis O1 of reference coordinate system 11. Grating line 30a has a first section A and a second section B adjoining first section A. First section A of grating line 30a is approximated by the first group of segments 24a, 24b. Second section B of grating line 30a is approximated by the second group of segments 26a through 26c. The longitudinal axis of first segment 24a of the first group has a first predetermined angle φ1 relative to first coordinate axis O1 of reference coordinate system 11. The longitudinal axis of last segment 26c of the second group has a second predetermined angle φ2, different from first predetermined angle φ1, relative to first coordinate axis O1 of reference coordinate system 11. First predetermined angle φ1 corresponds to an inclination of grating line 30a associated with the position of first segment 24a. Second predetermined angle φ2 corresponds to an inclination of grating line 30a associated with the position of last segment 26c. This means that first predetermined angle φ1 and second predetermined angle φ2 indicate the different inclinations at the position of first segment 24a and at the position of last segment 26c, respectively. As illustrated in FIG. 4, the two sections A, B of grating line 30a meet at a boundary point G1. An inclination of grating line 30a defined in boundary point G1 is given by an angle (i.e., tangent angle) relative to first coordinate axis O1 of reference coordinate system 11, which angle corresponds to an average of first predetermined angle φ1 and second predetermined angle φ2.

The angle of the longitudinal axis of segment 24b of the first group and/or the angles of the longitudinal axes of one or both segments 26a, 26b of the second group are each randomly selected from the entirety of first predetermined angle φ1 and second predetermined angle φ2. Thus, the angles associated with segments 24b and 26a, 26b each correspond to first predetermined angle φ1 or second predetermined angle φ2. This enables stochastic blurring of the orientations of segments 24b and 26a, 26b, in particular near boundary point G1.

Figure 5:
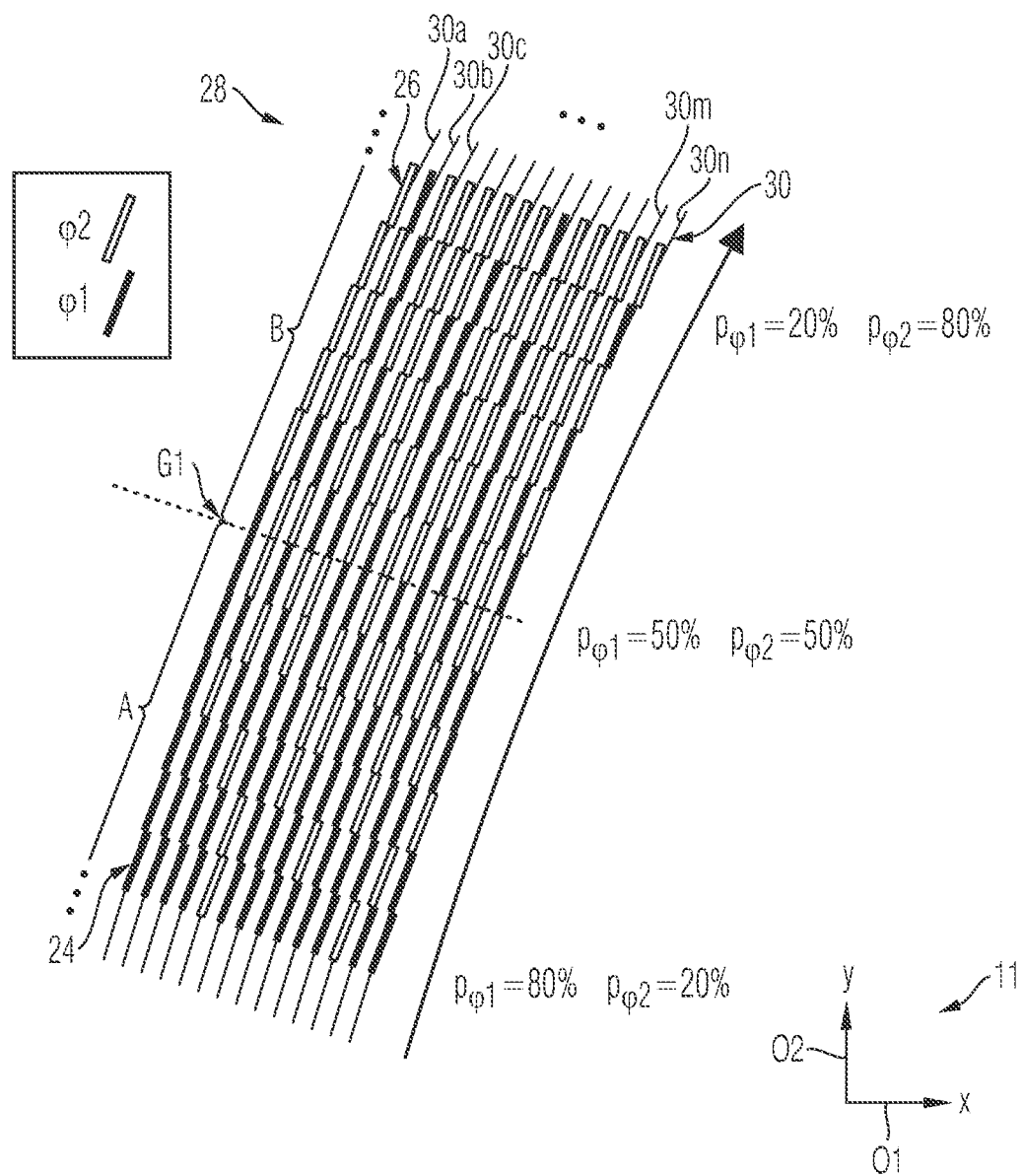
FIG. 5 is a schematic view illustrating a stochastic blurring of the orientations of segments of the first and second groups.

FIG. 5 illustrates, in schematic form, a stochastic blurring of the orientations of segments 24, 26 of the first and second groups. Segments 24, 26 of grating lines 30a through 30n (grating lines 30) in FIG. 5 correspond to the respective segments 24a, 24b and 26a through 26c of grating line 30a in FIG. 4. FIG. 5 further shows the two sections A, B of grating lines 30, which meet at boundary points G1 (see the broken line in FIG. 5).

In accordance with FIG. 5, the longitudinal axes of a major portion of the segments 24 of the first group have the first predetermined angle φ1 relative to first coordinate axis O1 of reference coordinate system 11, while the longitudinal axes of a major portion of the segments 26 of the second group have the second predetermined angle φ2 relative to first coordinate axis O1 of reference coordinate system 11. FIG. 5 further illustrates that one or more of the angles of the longitudinal axes of the segments 24 of the first group and/or one or more of the angles of the longitudinal axes of the segments 26 of the second group are each randomly selected from the entirety of first predetermined angle φ1 and second predetermined angle φ2. In FIG. 5, the selection of first predetermined angle φ1 is in each instance indicated by a filled rectangle, while the selection of second predetermined angle φ2 is in each instance indicated by an unfilled rectangle.

Preferably, the randomly selected angles of the longitudinal axes of the segments 24, 26 of the first group and/or second group each correspond with a first probability $p_{\varphi 1}$ to first predetermined angle φ1 and with a second probability $p_{\varphi 2}$ to second predetermined angle φ2. Referring to FIG. 5, the first and second probabilities near the middle of first section A are 80% and 20%, respectively, while the first and second probabilities near the middle of second section B are 20% and 80%, respectively. At boundary point G1 (broken line), the first and second probabilities are each 50%. Thus, the first probability decreases from the middle of first section A toward the middle of second section B, while the second probability decreases from the middle of second section B toward the middle of first section A. Furthermore, the first and second probabilities at boundary point G1 are equal, so that the stochastic blurring is greatest there.

In particular, the first and second probabilities are each dependent on a distance of the individual segments 24, 26 of the first group and/or the second group from boundary point G1. The first probability decreases with decreasing distance of the individual segments 24 of the first group shown in FIG. 5 from boundary point G1. Moreover, the second probability decreases with decreasing distance of the individual segments 26 of the second group shown in FIG. 5 from boundary point G1. The first and second probabilities are each 50% where the distance between an individual segment of the first group and boundary point G1 is minimum and/or where the distance between an individual segment of the second group and boundary point G1 is minimum (i.e., for the segments 24, 25 of the first group and/or the second group that are adjacent to boundary point G1).

Figure 6:
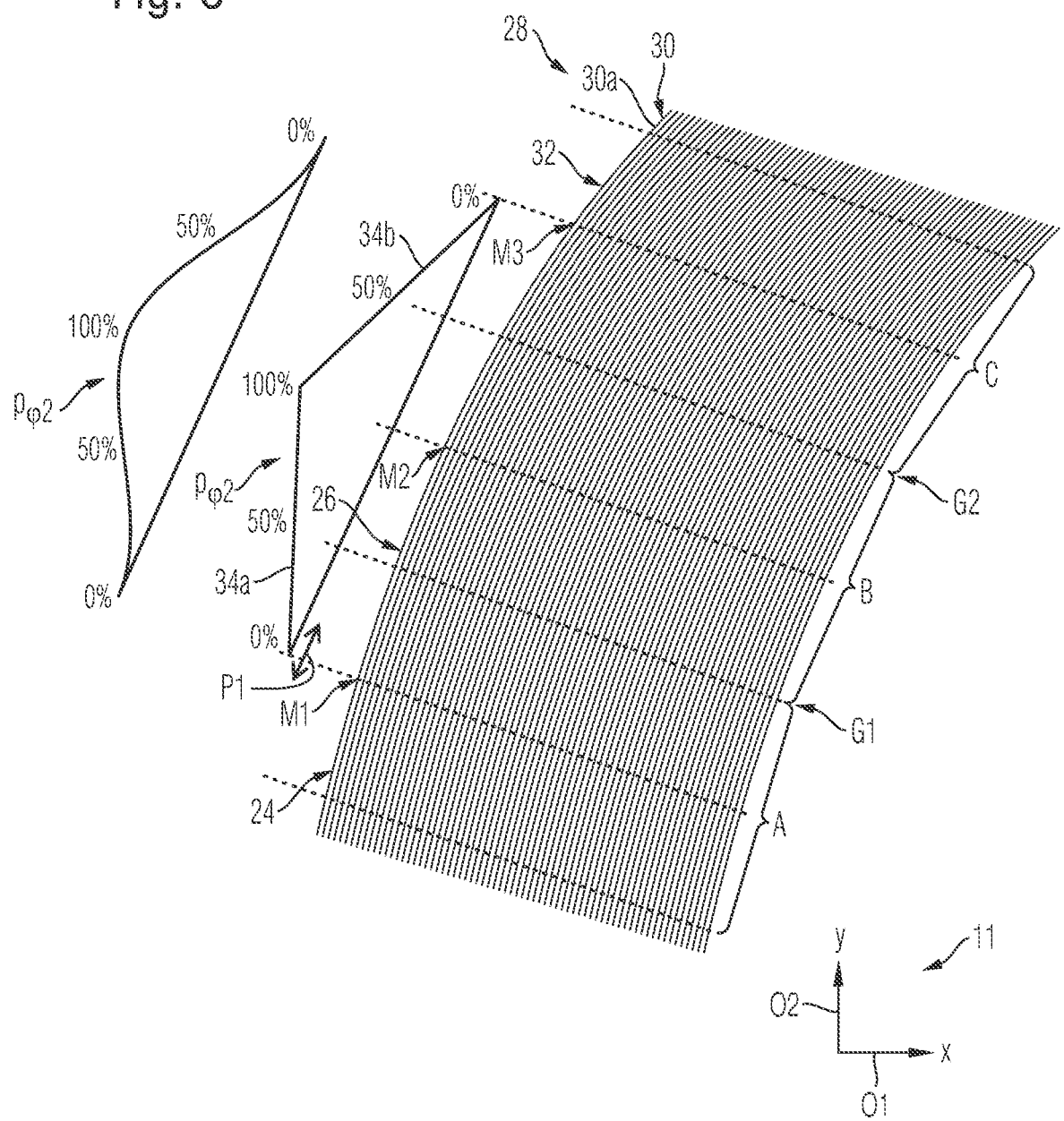
FIG. 6 is a schematic view illustrating a probability profile extending at least over a portion of the segments of the first and second groups.

FIG. 6 illustrates, in schematic form, a probability profile ($p_{\varphi 2}$) extending at least over a portion of the segments 24, 26 of the first and second groups. In FIG. 6, a further section C of grating line 30a is shown in addition to sections A, B of grating line 30a. Sections A, B meet at boundary points G1, while sections B, C meet at the further boundary points G2. Sections A, B include the segments 24, 26 of the first and the second groups, while section C includes further segments 32 of a third group. The longitudinal axes of a major portion of the segments 32 of the third group have a third predetermined angle (φ3), different from first and second predetermined angles φ1, φ2, relative to first coordinate axis O1 of reference coordinate system 11. FIG. 6 further shows the midpoints M1 through M3 of the corresponding sections A through C.

In particular, FIG. 6 shows a macroscopic view of grating structure 28. The grating structure 28 according to FIG. 6 is composed of millions or even billions of individual microscopic segments.

FIG. 6 shows only the profile of the second probability $p_{\varphi 2}$, which has a maximum at midpoint M2. However, the following explanations also apply analogously to the profile of the first probability $p_{\varphi 1}$ (not shown in FIG. 6), which has a maximum at midpoint M1.

As illustrated in FIG. 6, the profile of the second probability has a maximum (e.g., a maximum value of 100%) at midpoint M2 and two minima (e.g., maximum values of 0%) at midpoints M1 and M3. Moreover, the profile of the second probability has two linearly falling edges 34a, 34b. At midpoints G1, G2, the values of the falling edges 34a, 34b are each 50%, for example. Instead of linearly falling edges 34a, 34b, the profile of the second probability may also have a different shape, as indicated in FIG. 6. In particular, the profile of the second probability may also have linearly or exponentially falling edges. In addition, the profile of the second probability may also be modified or adapted such that the minima located at midpoints M1 and M3 are shifted toward or away from section B. This is symbolized in FIG. 6 by double-headed arrow P1.

Figure 7:
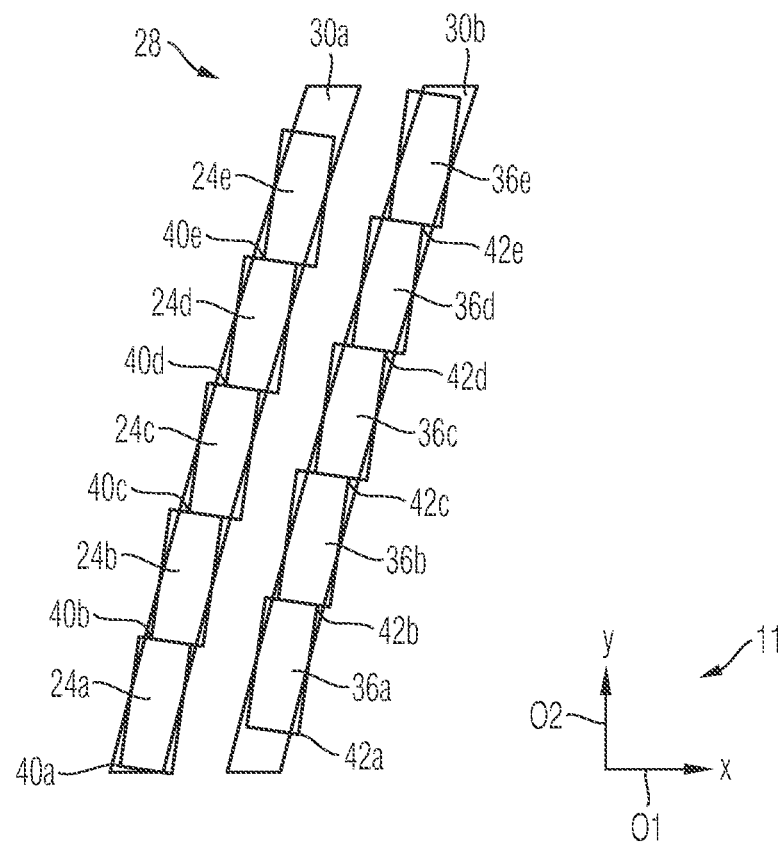
FIG. 7 is a representation of two adjacent grating lines of the inventive grating structure, which grating lines are each approximated by a plurality of successive segments whose positions have a stochastic offset relative to one another.

FIG. 7 shows the two adjacent grating lines 30a, 30b of grating structure 28. Each of the two grating lines 30a, 30b is approximated by a plurality of successive segments 24a through 24e and 36a through 36e (segments 24, 36), respectively. As illustrated in FIG. 7, segments 24a through 24e and 36a through 36e have positions, in particular starting positions 40a through 40e and 42a through 42e, respectively, which are offset relative to one another along a longitudinal extent of grating lines 30a, 30b. The offset of these positions 40a through 40e and 42a through 42e (positions 40 and 42) along the longitudinal extent of grating lines 30a, 30b is selected at random.

Figure 8:
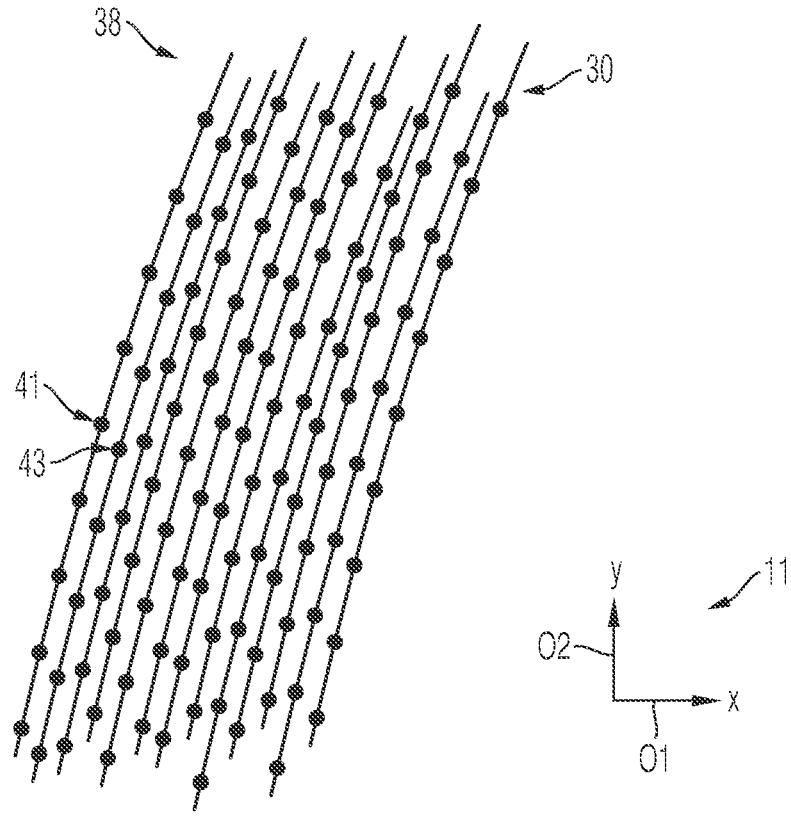
FIG. 8 is a schematic view illustrating an irregular arrangement of approximation corners, which results from the stochastic positional offset shown in FIG. 7.

FIG. 8 shows a schematic view illustrating an irregular arrangement 38 of approximation corners; i.e., edges of the segments 24, 36 meeting at positions 40, 42, which results from the stochastic positional offset described with reference to FIG. 7. In FIG. 8, the approximation corners 41 and 43 located at the respective positions 40 and 42 are represented by points through which grating lines 30 extend. As shown in FIG. 8, the stochastic positional offset differs from grating line to grating line in such a way that an, as it were, amorphous arrangement 38 of approximation corners 41, 43 is formed. This makes it possible to effectively suppress the formation of a two-dimensional supergrating, which may result from an, as it were, crystalline arrangement of approximation corners. Consequently, it is also possible to substantially mask out unwanted diffraction effects occurring at such a supergrating.

Figure 9:
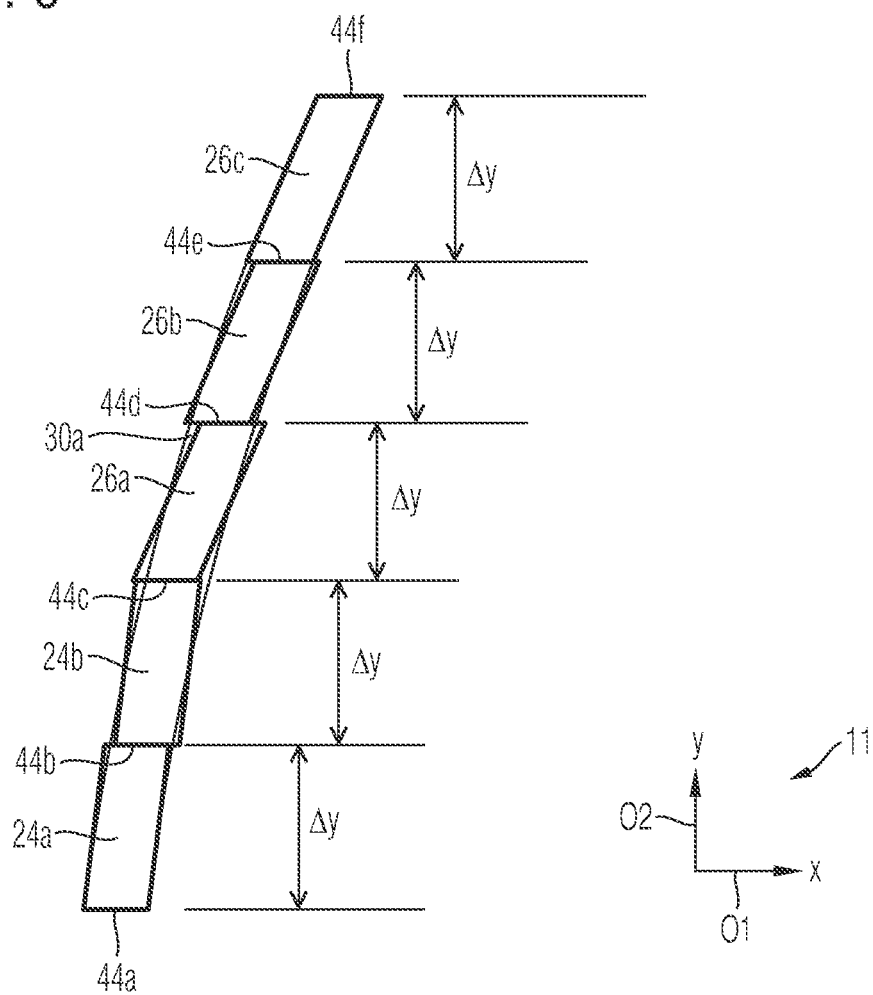
FIG. 9 is a view showing a grating line of the inventive grating structure, which grating line is approximated by a plurality of successive, parallelogram-shaped segments of a first group and a second group.

FIG. 9 shows another representation of grating line 30a of grating structure 28. Again, grating line 30a is approximated by a plurality of successive segments 24a, 24b and 26a through 26c of the first and second groups. Instead of the rectangular segments 24a, 24b and 26a through 26c used for approximation of grating line 30a according to FIG. 4, the segments 24a, 24b and 26a through 26c used for approximation of grating line 30a according to FIG. 9 are each parallelogram-shaped. As illustrated in FIG. 9, short sides 44a through 44f of parallelogram-shaped segments 24a, 24b and 26a through 26c (segments 24, 26) are each parallel to first coordinate axis O1 of reference coordinate system 11. Furthermore, the segments 24, 26 shown in FIG. 9 each have the same extent (Δy) along second orthogonal coordinate axis O2 of reference coordinate system 11, which is orthogonal to first coordinate axis O1. The use of the parallelogram shape makes it possible to prevent overlap errors, i.e., regions of unwanted overlapping or non-contiguity of segments at the edges of adjacent segments.

In the case of an approximation of nearly horizontal grating lines; i.e., in the case of angles greater than 45° between the longitudinal extent of the grating lines and second coordinate axis O2, the parallelogram-shaped segments 24, 26 may also be configured such that their short sides are each parallel to second coordinate axis O2 of reference coordinate system 11 instead of being parallel to first coordinate axis O1 of reference coordinate system 11.

In the present invention, unlike in the prior art, the grating lines are not approximated as a function of a minimum line edge roughness to be achieved, but preferably using a stochastic blurring (i.e. stochastic mixing) of the orientations of the segments. This is because in the first case, the orientations of the segments change abruptly at the boundary points between respective adjacent sections of the grating lines. This, in turn, causes the macroscopic effect of a sudden change in light diffraction at the section and/or zone boundaries. However, this effect can be avoided by the stochastic blurring.

In accordance with the present invention, the stochastic blurring occurs already before the boundary (i.e., changeover line) defined by the boundary points. The closer the segments are to the boundary line, the higher is the degree of stochastic blurring. Directly at the changeover line, the probability for the setting or selection of the respective orientations is in each case 50%. The mixing zone is characterized by the profile of the stochastic probabilities. In particular, the probabilities each decrease, for example linearly or sinusoidally, starting at a maximum (probability 100%). To achieve stochastic blurring over as wide an area as possible, the beginning of the mixing zone; i.e., the point at which the respective probability is 0%, is preferably set at the positions where the inclination of the grating lines is given by respective predetermined angles; i.e., approximately at the middle of the respective adjacent zone.

However, the point at which the respective probability is 0% can also be shifted inward or outward as desired. This should then be done analogously for all existing angular steps, i.e., for all probability profiles associated with the respective sections or zones. In particular, if the point is shifted outward, a three-angle mixing scheme should be used. It is also possible to mix four angles, preferably near the boundary line. In the case of a three-angle or four-angle mixing scheme, at least the probability profiles associated with the respective adjacent sections and those associated with one or more additional sections (i.e., the next-but-one sections which are adjacent to the respective first-mentioned sections and are located opposite one another with respect thereto) should at least partially overlap each other.

In the present invention, the effective line edge roughness does, in fact, increase, but the sharp, microscopic angular transition (i.e., the abrupt change in orientation) between the zones is blurred. The profile of the probabilities may also be given by other mathematical functions, which means, in particular, that it is not limited to linearly or sinusoidally falling edges. Moreover, a double or multi-pass exposure may be performed to reduce line edge roughness.

The inventive grating structure (or a grating structure produced by copying) is suitable for use in a diffractive optic, such as, for example, in diffractive optical elements or in a diffraction grating.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 system
11 reference coordinate system
12 electron beam
14 plate-shaped aperture structure
16 square aperture
18 square-trimmed portion
20 plate-shaped aperture structure
22a-22l reticle
24a-24e (24) segment
25 substrate surface
26a-26c (26) segment
28 grating structure
30a-30n (30) grating line
32 segment
34a, 34b edge
36a-36e (36) segment
38 amorphous arrangement
40a-40e (40) position
41 approximation corners
42a-42e (42) position
43 approximation corners
44a-44f short side
A-C section
G1, G2 boundary point
M1-M3 midpoint
O1, O2 coordinate axis
P1 double-headed arrow
$p_{\varphi 1}, p_{\varphi 2}$ probability Δy extent
φ1, φ2 predetermined angle

What is claimed is:

1. A grating structure for a diffractive optic, the grating structure comprising:
a plurality of grating lines, each of the grating lines being approximated by a plurality of successive segments, longitudinal axes of the segments each having an angle relative to a first coordinate axis of a reference coordinate system, a first section of a first one of the grating lines being approximated by a first group of the segments, and a second section adjacent to the first section of the first one of the grating lines being approximated by a second group of the segments,
wherein the longitudinal axes of a major portion of the segments of the first group have a first predetermined angle relative to the first coordinate axis of the reference coordinate system, and the longitudinal axes of a major portion of the segments of the second group have a second predetermined angle different from the first predetermined angle relative to the first coordinate axis of the reference coordinate system, and
wherein one or more of the angles of the longitudinal axes of the segments of the first group and/or one or more of the angles of the longitudinal axes of the segments of the second group are each randomly selected from an entirety of at least the first predetermined angle and the second predetermined angle.

2. The grating structure as recited in claim 1, wherein the randomly selected angles of the longitudinal axes of the segments of the first group and/or the second group each correspond with a first probability to the first predetermined angle and with a second probability to the second predetermined angle.

3. The grating structure as recited in claim 2, wherein the first probability and the second probability are dependent on a distance of the individual segments of the first group and/or the second group from a boundary point at which the two sections of the grating line meet.

4. The grating structure as recited in claim 3, wherein the first probability decreases with decreasing distance of at least a portion of the individual segments of the first group from the boundary point.

5. The grating structure as recited in claim 3, wherein the second probability decreases with decreasing distance of at least a portion of the individual segments of the second group from the boundary point.

6. The grating structure as recited in claim 3, wherein the first probability and the second probability are each 0.5 where the distance between an individual segment of the first group and boundary point is minimum and/or where the distance between an individual segment of the second group and boundary point is minimum.

7. The grating structure as recited in claim 2, wherein the first probability and/or the second probability each have a profile extending over at least a portion of the segments of the first and second groups.

8. The grating structure as recited in claim 7, wherein the profile of the first probability has a maximum at one of the segments of the first group which is located at a midpoint of the first section of the first one of the grating lines, and/or wherein the profile of the second probability has a maximum at one of the segments of the second group which is located at a midpoint of the second section of the first one of the grating lines.

9. The grating structure as recited in claim 7, wherein the profile of the first probability has a minimum at one of the segments of the second group which is located at a midpoint of the second section of the first one of the grating lines, and/or wherein the profile of the second probability has a minimum at one of the segments of the first, group which is located at a midpoint of the first section of the first one of the grating lines.

10. The grating structure as recited in claim 9, wherein the minimum of the profile of the first probability and/or the minimum of the profile of the second probability are/is shifted relative to the midpoint of the second or first section, respectively, of the first one of the grating lines toward or away from the respective other section of the first one of the grating lines.

11. The grating structure as recited in claim 7, wherein the profile of the first probability and/or the profile of the second probability have/has a linearly, sinusoidally or exponentially falling edge.

12. The grating structure as recited in claim 1, wherein the segments of at least two adjacent ones of the grating lines have positions which are offset relative to one another along a longitudinal extent of the at least two adjacent ones of the grating lines, and wherein the offset is selected at random.

13. The grating structure as recited in claim 1, wherein the segments of the first and second groups are each parallelogram-shaped, wherein short sides of the parallelogram-shaped segments are each parallel to the first coordinate axis of the reference coordinate system, and wherein the segments of the first and second groups each have the same extent along a second coordinate axis of the reference coordinate system, the second coordinate axis being orthogonal to the first coordinate axis.

14. The grating structure as recited in claim 1, wherein the segments for approximating the grating lines are each exposure areas produced on a substrate surface by cell projection using different, individually selectable reticles.

15. The grating structure as recited in claim 1, wherein the first one of the grating lines is an at least partially curved grating line approximated by the different predetermined angles of the longitudinal axes of the major portions of the segments.

16. The grating structure as recited in claim 1, wherein a third section of the first one of the grating lines is approximated by a third group of the segments, wherein the longitudinal axes of a major portion of the segments of the third group have a third predetermined angle different from the first and second predetermined angles relative to the first coordinate axis of the reference coordinate system.

17. The grating structure as recited in claim 16, wherein one or more of the angles of the longitudinal axes of the segments of the first group, the second group and the third group are each randomly selected from an entirety of at least the first, second and third predetermined angles.

* * * * *